United States Patent [19]

Puar

[11] Patent Number: 5,506,499

[45] Date of Patent: Apr. 9, 1996

[54] MULTIPLE PROBING OF AN AUXILARY TEST PAD WHICH ALLOWS FOR RELIABLE BONDING TO A PRIMARY BONDING PAD

[75] Inventor: Deepraj S. Puar, Sunnyvale, Calif.

[73] Assignee: NeoMagic Corp., Santa Clara, Calif.

[21] Appl. No.: 460,847

[22] Filed: Jun. 5, 1995

[51] Int. Cl.[6] .............................. H05K 1/18; H01K 3/10; G01R 31/02; G01R 31/00
[52] U.S. Cl. .......................................... 324/158.1; 29/847
[58] Field of Search ............................... 324/73.1, 158.1; 437/8; 29/830, 852; 148/DIG. 71; 219/121.9; 357/67; 427/97

[56] References Cited

U.S. PATENT DOCUMENTS

| | | | |
|---|---|---|---|
| 4,916,809 | 4/1990 | Boudou et al. | 29/852 |
| 5,051,691 | 9/1991 | Wang | 324/73.1 |
| 5,060,116 | 10/1991 | Grobman et al. | 361/474 |
| 5,153,507 | 10/1992 | Fong et al. | 324/158 R |
| 5,162,893 | 11/1992 | Okano | 257/203 |
| 5,206,583 | 4/1993 | Dawson et al. | 324/73.1 |
| 5,217,917 | 7/1993 | Takahashi et al. | 437/51 |
| 5,239,191 | 8/1993 | Sakumoto et al. | 257/203 |
| 5,275,897 | 1/1994 | Nagesh et al. | 430/22 |
| 5,281,855 | 1/1994 | Hadden et al. | 257/784 |
| 5,287,000 | 2/1994 | Takahashi et al. | 257/676 |
| 5,319,224 | 6/1994 | Sakashita et al. | 257/203 |
| 5,326,709 | 7/1994 | Moon et al. | 437/8 |

*Primary Examiner*—Kenneth A. Wieder
*Assistant Examiner*—Barry C. Bowser
*Attorney, Agent, or Firm*—Stuart T. Auvinen

[57] ABSTRACT

Each touchdown of a probe card during wafer-sort testing of integrated circuits can leave a gouge in the pad metal. These gouges reduce the reliability of any wire bond to that pad as voids can be left in the bond where the gouges are. A second auxiliary test pad is adjacent to the primary bonding pad. This second auxiliary test pad is electrically connected to the primary bonding pad. Thus probes can land on the second auxiliary pad rather than the primary pad. Gouges are made on the second pad rather than the primary pad. This second test pad allows for multiple probing. Multiple probing is needed for testing large embedded memories on large logic chips such as video controllers. The yield of large memories is increased by laser repair. Probing and testing is required both before and after laser repair using a memory test machine. However, a logic test machine is used to test the logic controller portion of the IC, but cannot generate the millions of test vectors needed to fully test the embedded memory. Only the pins that are used for both memory testing and logic testing need the second auxiliary pads. Thus the probes can land on the second test pads multiple times while the wire bond is made to the primary bonding pad.

19 Claims, 8 Drawing Sheets

MULTIPLE PROBING OF AN AUXILARY TEST PAD WHICH ALLOWS FOR RELIABLE BONDING TO A PRIMARY BONDING PAD

BACKGROUND OF THE INVENTION

1. Field of the Invention

This invention relates to wafer testing of integrated circuits, and more particularly for methods to test complex LSI chips having both controller logic and memory.

2. Description of the Related Art

Rapid advances in semiconductor process technology has resulted in a marked increase in the density of functions that may be integrated onto a chip. LSI chips may include large logic blocks containing thousands of gates. Large memories may also be combined on the same silicon die with the logic blocks. One particular LSI application is for a graphics memory controller chip. The graphics or video controller contains several large, complex logic blocks to manipulate and control pixel data which forms the video image to be displayed on a screen. A large video memory of one-half to several megabytes is controlled by this video controller. This size is larger by several orders of magnitude than static-RAM cache memories commonly used on microprocessor chips. Video memories must use dynamic RAM (DRAM) to achieve the mega-byte memory size while cache memories can use faster SRAM since only a few K-bytes are needed.

While smaller cache memories can be tested on a standard logic test machine simply by writing test vectors to test each SRAM memory cell, the large size of the video DRAM memory requires a huge number of test vectors. Special testers have been developed for testing large memories such as DRAMs. These memory testers can generate the test vectors in real time from a test program. For example, the test program may be written in a higher-level programming language. The test program includes statements in a loop construct that are repeated thousands of times. These statements generate a test vector each time the loop is iterated. In contrast, a logic tester simply contains a storage area containing the test vectors themselves which are sequentially retrieved from the logic tester's storage area and sent to the device under test. The logic test 'program' therefore does not have to be written in a higher-level programming language but merely causes previously-written test vectors to be retrieved from storage and sent to the pins of the device or IC being tested.

A problem occurs when a large memory such as a DRAM is integrated onto the same silicon chip as a large logic controller. Since the logic tends to be random, a logic tester is needed to store vectors of test stimuli and expected outputs to test the random logic. These test patterns must be stored because there is no apparent pattern or sequence to the test vectors and thus they cannot be generated on the fly using logical statements in a test program. However, this storage is not large enough to test a large memory, since several million test vectors are needed to test a megabyte memory. A memory tester should be used since the memory tester can generate the test vectors from logical statements in a test program which describe a pattern or sequence. Common memory test patterns that can easily be described by such logical statements in a test pattern include up or down counter test patterns or checkerboard or walking ones or zeros patterns. Any hybrid tester which can perform both logic and memory tests would be too expensive and not cost-effective.

Thus each die or chip must be tested with two different tester machines—the controller logic is tested with a logic tester, while the large DRAM memory is tested with a memory tester. It is common to repair a memory by using a laser repair station which can blow 'fuses' on the die to enable redundant or spare memory cells to replace defective memory cells. The memory test must be repeated after repair to determine if the repair was successful.

The high cost of integrated circuit packages dictates that the logic and memory tests and laser repair be performed before the wafer is cut and the die are packaged. Wafer sort machines are used to successively connect the logic or memory tester with the die on the wafer. FIG. 1 shows that a silicon wafer is composed of many separate die 10. Each die 10 is separated from other die 10 by a scribe area 12. Each die 10 includes bonding pads 30. FIG. 2 is a cross-sectional view of a wafer-sort probe card above a wafer. The wafer sorter has a probe card 14 with small needle pins or probes 20 that are lowered to make contact with metal bonding pads 30 on the die 10 on the wafer.

While most probes 20 have tips that lie in a plane, occasionally one or more probes 20A is mis-aligned and has its tip below the other probe tips. Probe 20A makes contact with bonding pad 30A before the other probes 20. Indeed, for other probes 20 to make contact with bonding pads 30, additional pressure must be exerted on probe 20A after its has made contact with bonding pad 30A. This additional pressure or force can cause probe 20A to gouge out a portion of bonding pad 30A. Thus while aligned probes 20 make contact with bonding pads 30 as they touch the surface of pads 30, mis-aligned probe 20A has additional force placed upon it, gouging into pad 30A.

In a manufacturing production environment, it is not possible to have all probes perfectly aligned at all times. In addition, to ensure a firm electrical contact between probes 20 and bonding pads 30, an additional force is often applied. Thus even aligned probes 20 may leave gouge marks on pads 30, although the gouging from mis-aligned probe 20A is most severe.

MULTIPLE PROBING LEAVES GOUGES WHICH WEAKEN WIRE BONDING

Each separate test requires that the probes be lowered to again make contact with the die. This multiple probing leaves several small gouges on the metal bonding pads. Even a single gouge can reduce reliability of a bond made when the die is finally packaged. However, multiple gouges can seriously weaken the bond.

FIGS. 3A–3H illustrate how multiple probing can leave several gouges on a bonding pad which weaken the final wire bond to the bonding pad. In FIG. 3A, probe 20 is being lowered to make contact with bonding pad 30 on die 10. Contact has been make in FIG. 3B, and once the probe is removed, FIG. 3C, a small gouge 22 remains at the point of contact. For larger gouges, a small ridge or dam 24 may be formed when probe 20 pushes the metal in bonding pad 30 from gouge 22 to dam 24.

For most integrated circuits a wire is bonded to bonding pad 30 after one, or occasionally two, touchdowns of probe 20. Thus only one or two gouges 22 are present, so the bond is secure. However, embedded memories may require several additional touchdowns of probe 20. FIG. 3D shows a second touchdown of probe 20' for a memory test on a different test machine. A second gouge 26 is formed at the point of contact, FIG. 3E. The large size of the embedded memory dictates that laser repair be performed to increase the wafer's yield and thus reduce cost. After laser repair is accomplished, the embedded memory must again be tested on the memory tester, and a third touchdown with probe 20" occurs, FIG. 3F. The third touchdown leaves a third gouge 28.

FIG. 3G shows three gouges 22, 26, 28 left by three touchdowns with probe 20, 20', 20". When the die 10 is cut from the wafer and placed in a package, a small wire is used to electrically connect bonding pad 30 on die 10 to leads in the package. Wire 40 is bonded to bonding pad 30 by any of several well-known processes, such as ultrasonic bonding or thermo-sonic bonding.

Small voids can form above gouges 32, 36, 38. These voids can be enlarged by rims or dams 24 which may border larger gouges, especially when soft metal is used for bonding pad 30. These voids reduce the surface area of the bond between wire 40 and bonding pad 30 and hence weaken the bond. These voids also are high stress points which may weaken and enlarge over time from thermal cycling, and which may form cracks allowing wire 40 to pull apart from bonding pad 30. Since the process of heating and cooling occurs as the IC is operated by the end user, the failure may occur several years after manufacture.

What is desired is a method for testing logic integrated circuits with large embedded memories. It is also desired to probe these chips multiple times but without weakening the wire bond. A reliable wire bond using conventional bonding is desired despite gouges left by the multiple probing. It is further desired to provide immunity from mis-alignment of probe tips which can leave large gouge marks in the bonding pads.

SUMMARY OF THE INVENTION

Each touchdown of a probe card during wafer-sort testing of integrated circuits can leave a gouge in the pad metal. These gouges reduce the reliability of any wire bond to that pad as voids can be left in the bond where the gouges are. A second auxiliary test pad adjacent to the primary bonding pad is electrically connected to the primary bonding pad. Thus probes can land on the second auxiliary pad rather than the primary pad. Gouges are made on the second pad rather than the primary pad. This second test pad therefore allows multiple probing. Multiple probing is needed for testing large embedded memories on large logic chips such as video controllers.

A large-scale integrated circuit has a plurality of bonding pads. A logic controller connects to each of the plurality of bonding pads while a memory embedded in the large-scale integrated circuit is accessed by the logic controller but is not directly accessible by the plurality of bonding pads in a normal mode of operation. The plurality of bonding pads has a subset of shared pads.

Auxiliary test pads have a length and width sufficiently large for probing by a wafer-sort tester but insufficiently large for forming a wire bond to the auxiliary test pad. Each shared pad in the subset of shared pads is electrically connected to a different auxiliary test pad. A multiplexer means is connected to the shared pads. It connects the shared pads to the logic controller during the normal mode of operation but connects the shared pads directly to the memory during a memory test mode.

In further aspects a package surrounds the integrated circuit. The package has external leads for electrical connection to a system, and wires bonded to the external leads and bonded to the plurality of bonding pads but not bonded to the auxiliary test pads.

In other aspects spare memory cells are coupled to the memory. Fuse elements replace a connection to a faulty memory cell in the memory with a spare memory cell. The fuse elements are normally closed but are blown open by a laser pulse. The memory is a dynamic random-access memory having at least one million bits of storage. The logic controller is a video controller for manipulating pixel data for display on a screen, and the memory is a video memory containing pixel data for display on the screen.

The auxiliary test pads contain multiple gouges from probing before and after the fuse elements are blown, but the bonding pads have no more than two gouges per pad from probing. Thus reliability of the wires bonded to the bonding pads is increased by probing and gouging the auxiliary test pads rather than the bonding pads.

In other aspects the invention is a method for testing a complex integrated circuit which has a logic portion and an embedded memory. A sufficient force is applied to a first probe card to make electrical contact with auxiliary test pads on a die on a wafer. The embedded memory on the die is tested using the first probe card to connect the die to a memory test machine which applies voltages representing test inputs to the die and compares expected outputs to voltages output from the die. The wafer is transported from the memory test machine to a logic test machine. A sufficient force is applied to a second probe card to make electrical contact with primary bonding pads on the die, where each auxiliary test pad is electrically connected on the die to one of the primary bonding pads. The logic portion of the die is tested using the second probe card to connect the die to the logic test machine, which applies voltages representing test inputs to the die and compares expected outputs to the voltages output from the die.

The wafer is sawed into individual die, and good die that did not fail when tested on the logic test machine and when tested on the memory test machine are separated out. Wires are bonded to the primary bonding pads of the good die but not to the auxiliary test pads. Thus the auxiliary test pads are used for testing the embedded memory but not for bonding.

DETAILED DESCRIPTION

Figure 1:
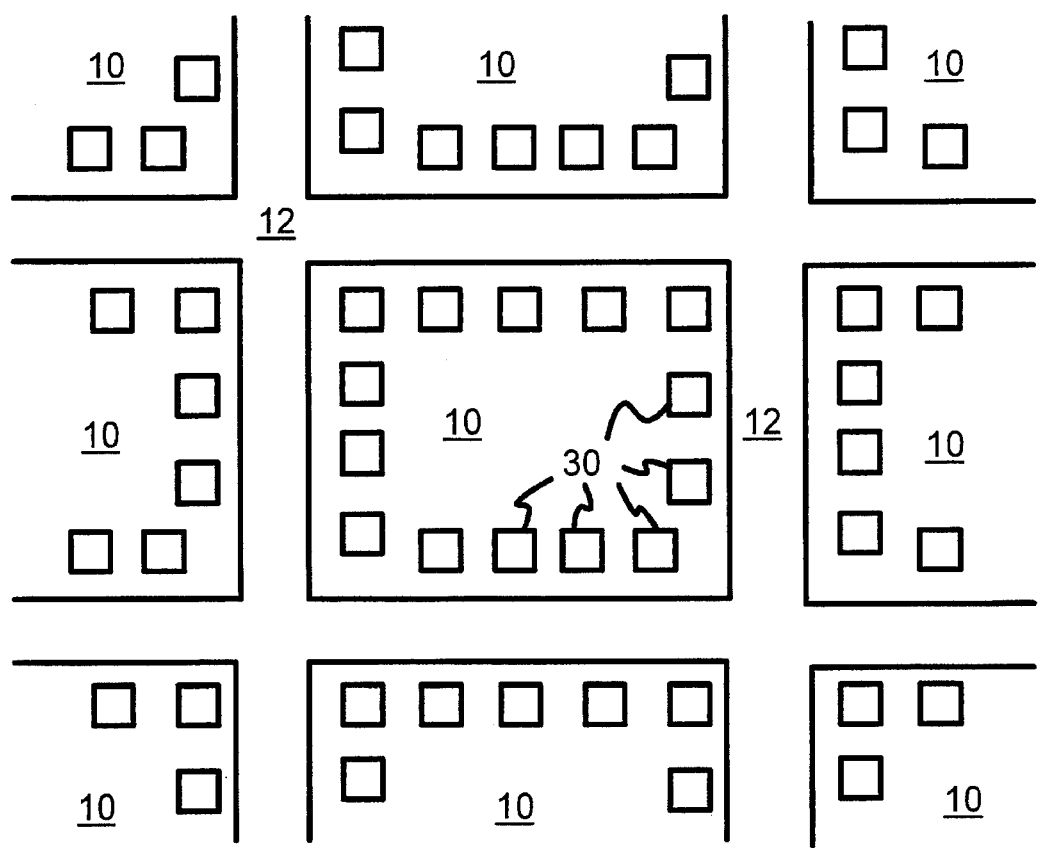
FIG. 1 shows that a silicon wafer is composed of many separate die.
Figure 2:
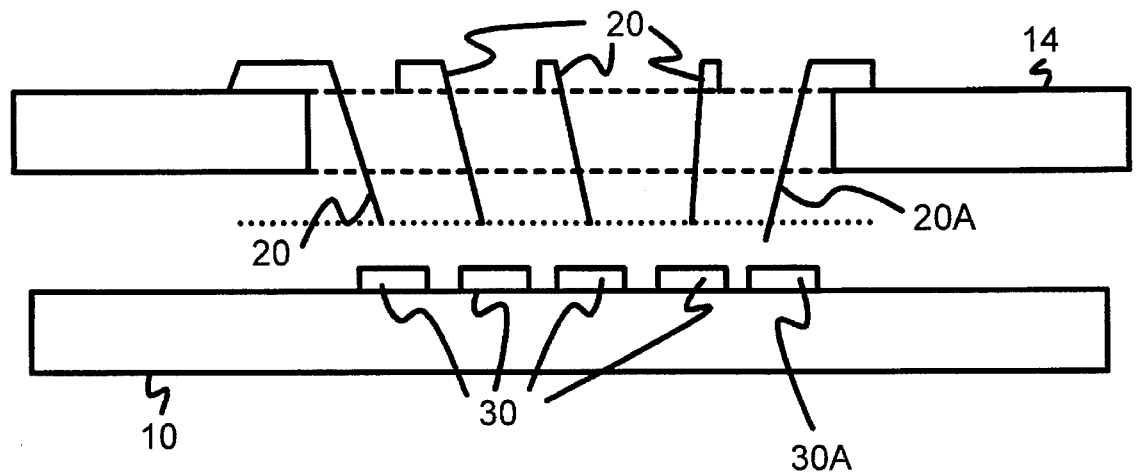
FIG. 2 is a cross-sectional view of a wafer-sort probe card above a wafer.
Figure 3A:
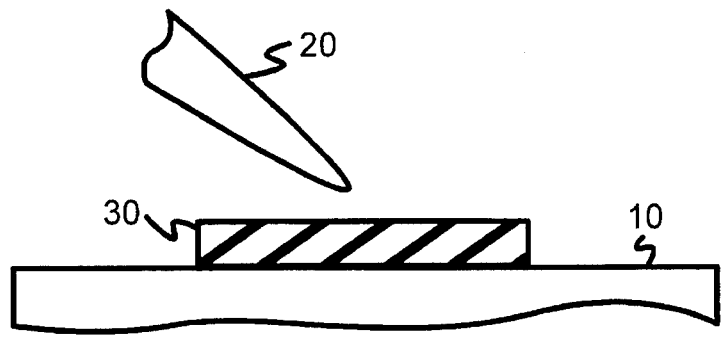
FIGS. 3A–3H illustrate how multiple probing can leave several gouges on a bonding pad which weaken the final wire bond to the bonding pad.
Figure 3B:
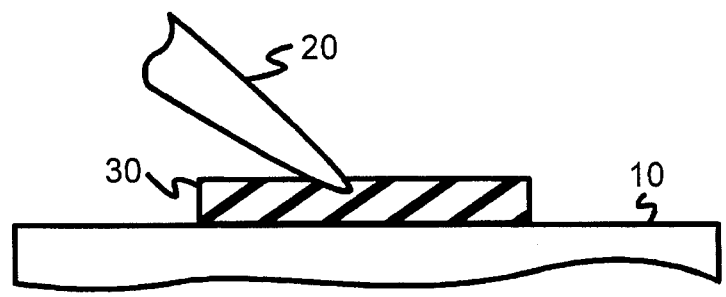
Figure 3C:
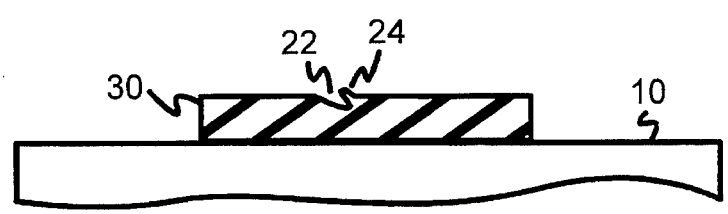
Figure 3D:
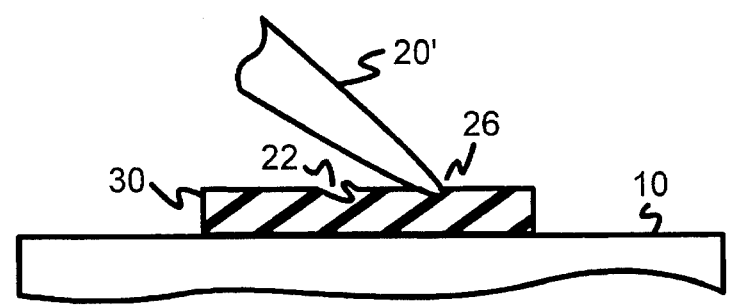
Figure 3E:
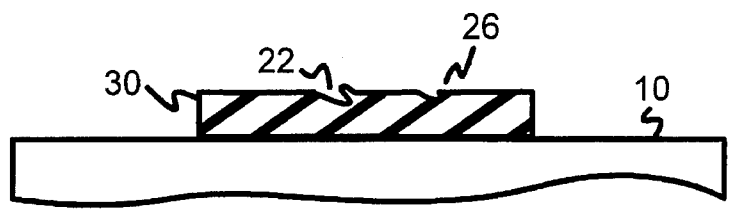
Figure 3F:
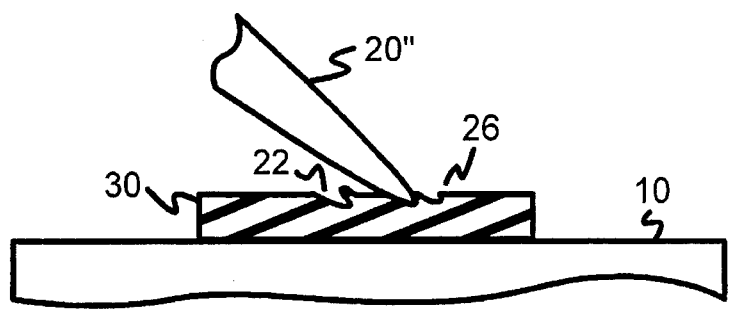
Figure 3G:
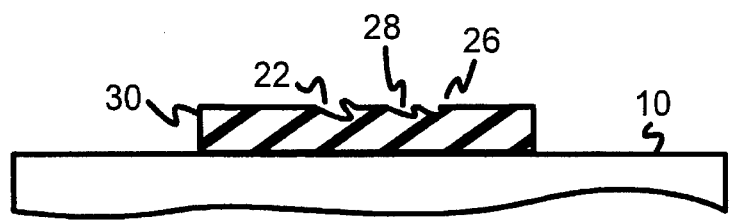
Figure 3H:
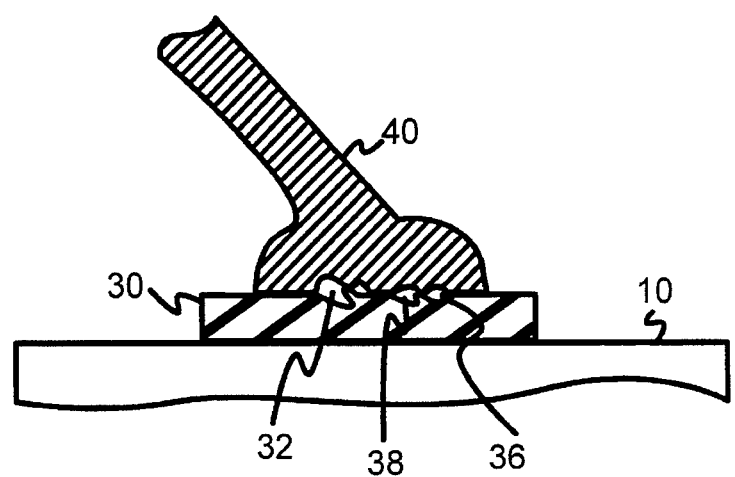

The present invention relates to an improvement in wafer testing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

SEPARATE LOGIC AND MEMORY TESTER MACHINES NEEDED

As noted in the background section, the large size of the embedded memory requires that a separate memory tester be used to test the memory. Millions of test vectors may be needed to fully test the memory; these test vectors may be generated by high-level programming-language statements in loop constructs which describe the pattern or sequence of the test vectors. For example, a counter pattern could be described simply by incrementing or decrementing a count value, and generating a test vector with a data field having this count value as binary bits of the binary number equivalent to the count value. These binary bits of the test vector would be converted to high and low voltages by the test machine for applying to the input pins of the device being tested.

The logic or controller portion of the chip is composed of mostly 'random' logic. The inputs to and outputs from this logic controller portion of the chip are therefore random-appearing, without any simple pattern or sequence such as a counter or a checkerboard pattern. Thus the test vectors cannot be simply described by a few high-level programming statements. Instead the vectors themselves must each be stored on the logic tester and sequentially retrieved from storage and applied to the device or IC chip being tested. These vectors are primarily composed of binary inputs ('ones and zeros') applied to the device as high and low voltages, or output conditions checked, such as high or low voltages being driven from the chip, or high impedance of an output.

While a small memory could be tested on a logic tester merely by explicitly specifying the test pattern as vectors of 'ones and zeros', the number of vectors required for a larger memory surpasses the capacity of the storage on the logic tester. A memory must test each memory cell several times to determine if the cell can hold both a low and a high value, and if the cell is shorted or leaks to its neighbor cells. Thus each cell must be tested a minimum of two times, and more if leakage and pattern sensitivity is tested. An 8K-byte embedded cache with an 8-bit I/O path requires at least 16,000 test vectors, but a 1 megabyte embedded video memory requires 4,000,000 or more test vectors. Since logic devices can exceed 200 pins, these four million vectors each have to be as much as 200 bits wide. Placing 100 GigaBytes of very high-speed memory on a logic tester is not economically feasible.

Logic testers often have a large number of pins or channels for testing logic devices, since high pincount IC's are common for logic devices. However, memory chips have few pins, and commercially available memory testers provide fewer channels than logic testers do. Thus only a subset of the logic pins may be needed to test the memory. A test mode connects some of the logic pins directly to the embedded memory while disconnecting the normal pin function. Multiplexers or the like may be used to implement this memory test mode. These multiplexers are placed on the shared pins, which are some of the input and output pins normally used by the logic controller portion of the chip. An extra pin or an unused or invalid combination of inputs may be used to initiate the test mode and mux the embedded memory's I/O to the shared pins.

WAFER TEST REQUIRES AT LEAST 3 PROBE TOUCHDOWNS

Figure 4:
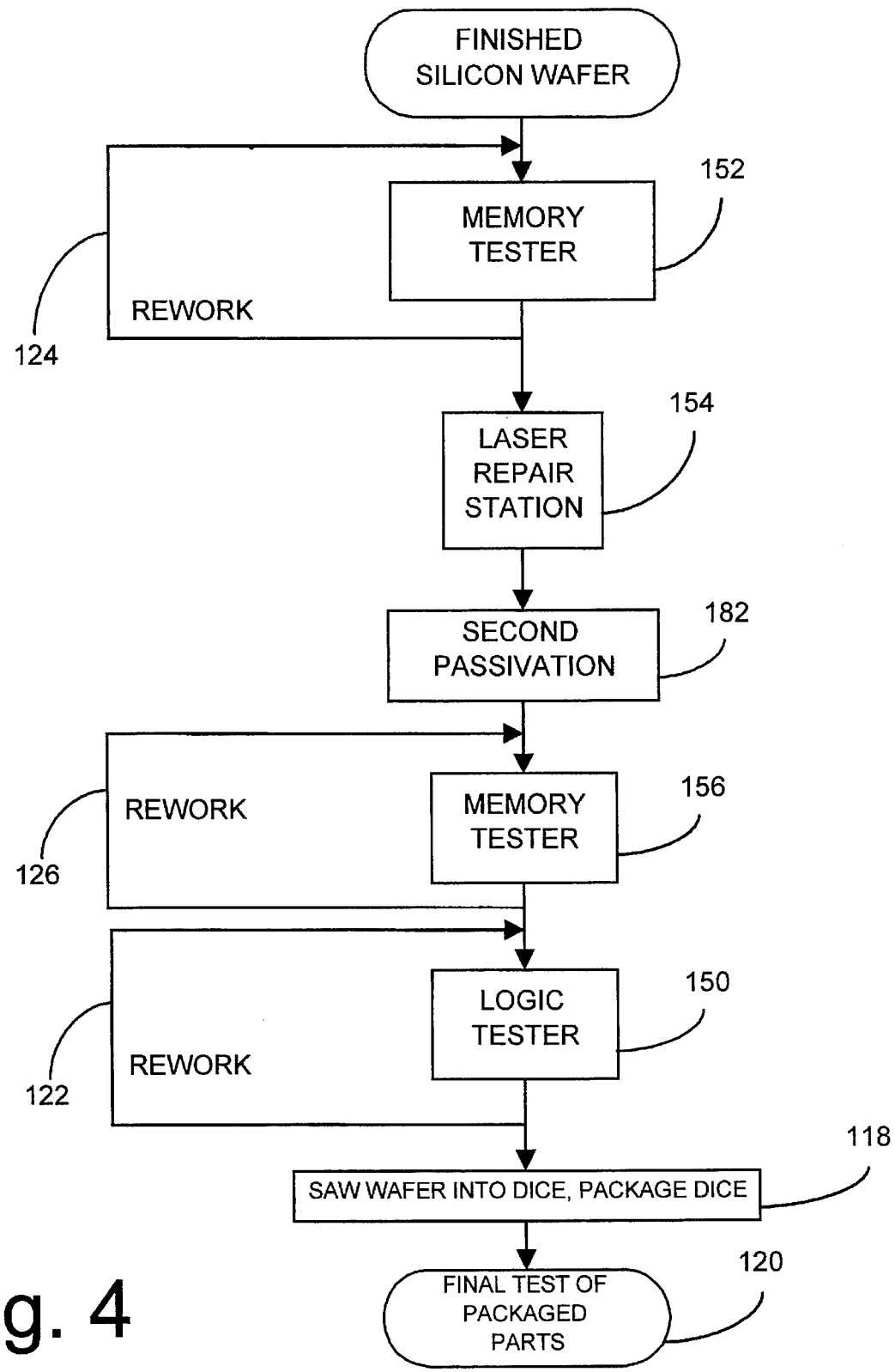
FIG. 4 is a flow diagram of a wafer-sorting and testing process for a logic circuit with an embedded memory.

FIG. 4 is a flow diagram of a wafer-sorting and testing process for a logic circuit with an embedded memory. The finished, but untested silicon wafer is first sent to a memory tester 152. Several million test vectors may be generated by a relatively simple test program executing on the memory tester, eliminating the need to store all of the test vectors. Die with non-functional memories are either marked if they cannot be repaired, or preferably mapped if they can be repaired. The map is stored and sent to laser repair station 154 along with the wafer. Laser repair station 154 attempts to repair faulty memory die by firing a pulse of a laser to blow fuse elements on the silicon die. The fuse elements may be thin and narrow metal or polysilicon areas that the laser targets to break an electrical connection. These fuses are used to determine which memory cells are replaced by spare memory cells. Typically a whole column or row of memory cells is replaced even if just one cell is faulty. The laser heats the passivation layer above the fuse which can open a hole in the passivation layer that must be sealed. A second passivation step 182 covers these holes over.

Since the laser repair process is not perfect, the repaired memory must again be tested by memory tester 156, which may be the same machine as memory tester 152 or a physically different machine. Indeed, the spare memory cells themselves may be faulty, or the fault may lie in the redundancy circuit which connects the spare cells and bypasses the faulty cells in the main memory array. Bad die are again mapped or marked by an ink drop.

The wafer is then sent to logic tester 150 which determines if the controller logic portions of the chips are functioning. Non-functional chips are typically marked with an ink spot. The wafer is scribed or sawed into individual die and good die are wire-bonded to a metal lead frame and encapsulated with plastic as part of the packaging process, step 118. The packaged die are then final tested using the package's leads to make electrical connection, step 120.

REWORK MAY INCREASE PROBING STEPS

The probe card must make physical contact with bonding pads on the die for each test, including once for the logic tester 150 and twice for the memory tester 152, 156. Thus at least three touchdowns of the probes to the bonding pads as needed. However, rework occurs on a small percentage of the wafers when a mistake is made or another problem occurs, or perhaps as a quality check. Other reasons for rework include malfunctioning test equipment, or the wrong test program being loaded. Rework 122 causes the logic tester 150 to make two touchdowns instead of just one, while rework 124, 126 can each add another touchdown when memory tester 152, 156 is reused for rework. Thus the total number of touchdowns is at least 3, but may be as high as 6. While one or two gouges is acceptable, 3 to 6 gouges is not acceptable, especially when higher and higher reliability is required.

SACRIFICIAL AUXILIARY PAD USED FOR MULTIPLE PROBING

Figure 5:
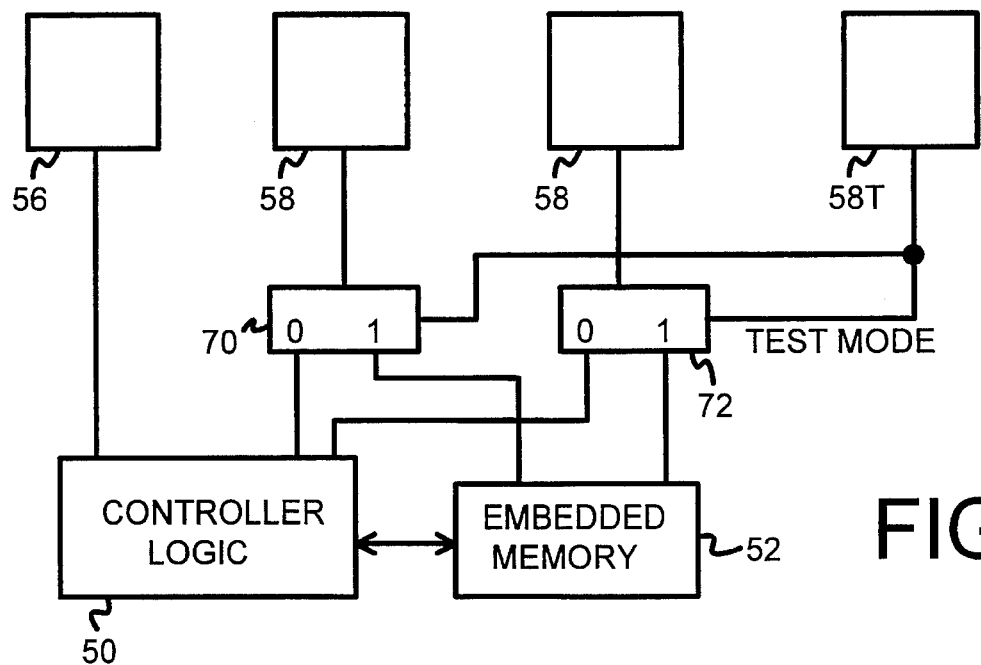
FIG. 5 shows bonding pads connected to a controller with an embedded memory.

FIG. 5 shows bonding pads connected to a controller with an embedded memory. Bonding pad 56 connects only to the controller logic 50 on the die while bonding pads 58 connect to both the controller logic 50 and the embedded DRAM memory 52. Bonding pads 58 connect to the controller logic 50 during normal operation, but during the test mode, bonding pads 58 connect directly through multiplexers 70, 72 to embedded DRAM memory 52. Multiplexers 70, 72 connect bonding pads 58 to controller logic 50 during normal operation, when test mode enable pin 58T has a low voltage applied to it. When a high voltage is applied to test mode enable pin 58T, then test mode is activated and multiplexers 70, 72 connect bonding pads 58 to embedded DRAM memory 52, allowing memory 52 to be directly tested from signals applied to bonding pads 58.

Figure 6:
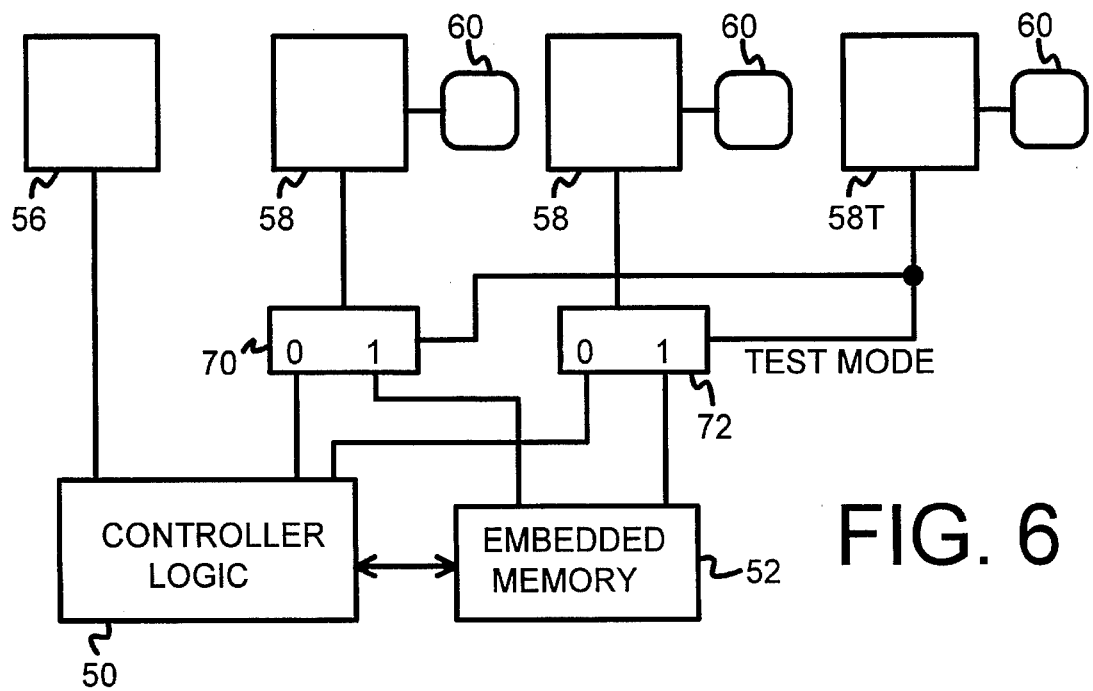
FIG. 6 shows bonding pads with auxiliary pads for multiple testing.

FIG. 6 shows bonding pads with auxiliary pads for multiple testing. Bonding pad 56 connects only to the controller logic 50 on the die while bonding pads 58 connect to both the controller logic 50 and the embedded DRAM memory 52. Each bonding pad 58 is electrically connected to one of auxiliary pads 60. Auxiliary pads 60 are used for wafer probing while bonding pads 58 are used for wire bonding. Since an auxiliary pad 60 is provided for each bonding pad 58 used to test embedded DRAM memory 52, gouges can be moved off of bonding pads 58 and onto auxiliary pad 60 by probing auxiliary pads 60 rather than probing bonding pads 58. An auxiliary pad 60 is also provided for test enable pin 58T since this pin 58T must be probed multiple times for memory testing.

Figure 7:
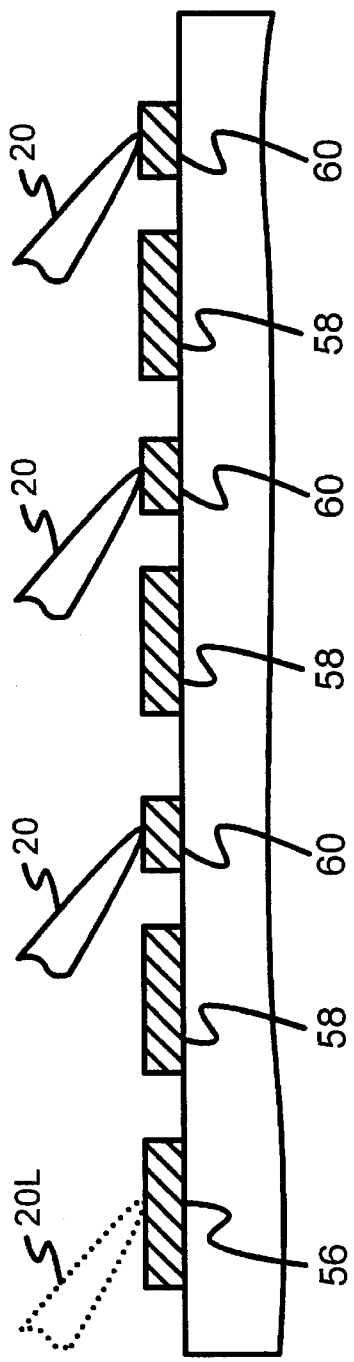
FIG. 7 shows wafer probes making contact to auxiliary pads rather than to bonding pads.

FIG. 7 shows wafer probes making contact to auxiliary pads rather than to bonding pads. Probes 20 make contact to auxiliary pads 60 rather than to primary bonding pads 58. However, bonding pad 56 is not connected to the embedded memory and is thus not probed multiple times. No auxiliary pad is needed for logic bonding pad 56. Probe 20L makes contact to logic bonding pad 56 for logic testing. For memory testing probe 20L is not present, as indicated by the dotted outline for probe 20L. The probe card for memory testing does not include probes for connecting to logic bonding pad 56, but only includes probes for connecting to auxiliary pads 60. However, the probe card used for logic testing includes probes for connecting to both logic bonding pads 56 and to auxiliary pads 60 or to primary bonding pads 58.

Figure 8:
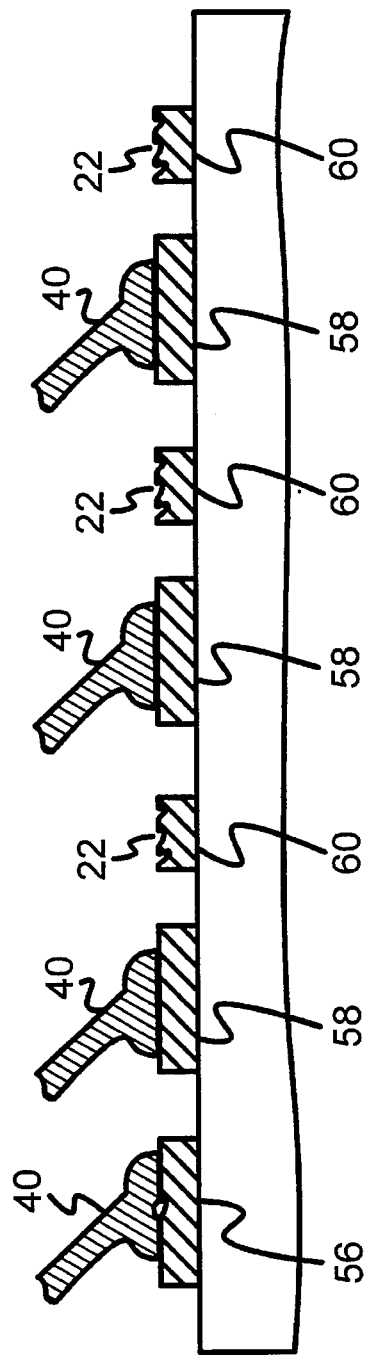
FIG. 8 shows that bonding is to the primary bonding pads while the gouges from wafer probing are left on the auxiliary pads.

FIG. 8 shows that bonding is to the primary bonding pads while the gouges from wafer probing are left on the auxiliary pads. After bonding and packaging, wires 40 connect leads in the package to bonding pads 56, 58. Auxiliary pads 60 contain several gouges 22 from multiple probing for memory testing before and after laser repair. Since wires 40 bond to primary bonding pads 58 and not to auxiliary pads 60, these gouges 22 cannot interfere with bonding or the reliability of the bond. Thus multiple probing, even with mis-aligned probe tips, can be accommodated without impacting reliability of the wire bonds.

Voids may still occur on the bond to logic bonding pad 56, since logic bonding pads 56 are not provided with auxiliary pads and must be probed. However, since logic bonding pads 56 do not need to be probed for memory testing, multiple probes do not occur for this pad. Thus only one, or at most two, gouges can occur on logic bonding pad 56, which has sufficient reliability for current standards. Auxiliary pads 60 are 'sacrificed' for multiple probing, allowing primary bonding pads 58 to form solid, reliable bonds to wires 40.

AUXILIARY TEST PADS ONLY NEEDED FOR MEMORY PADS

Figure 9:
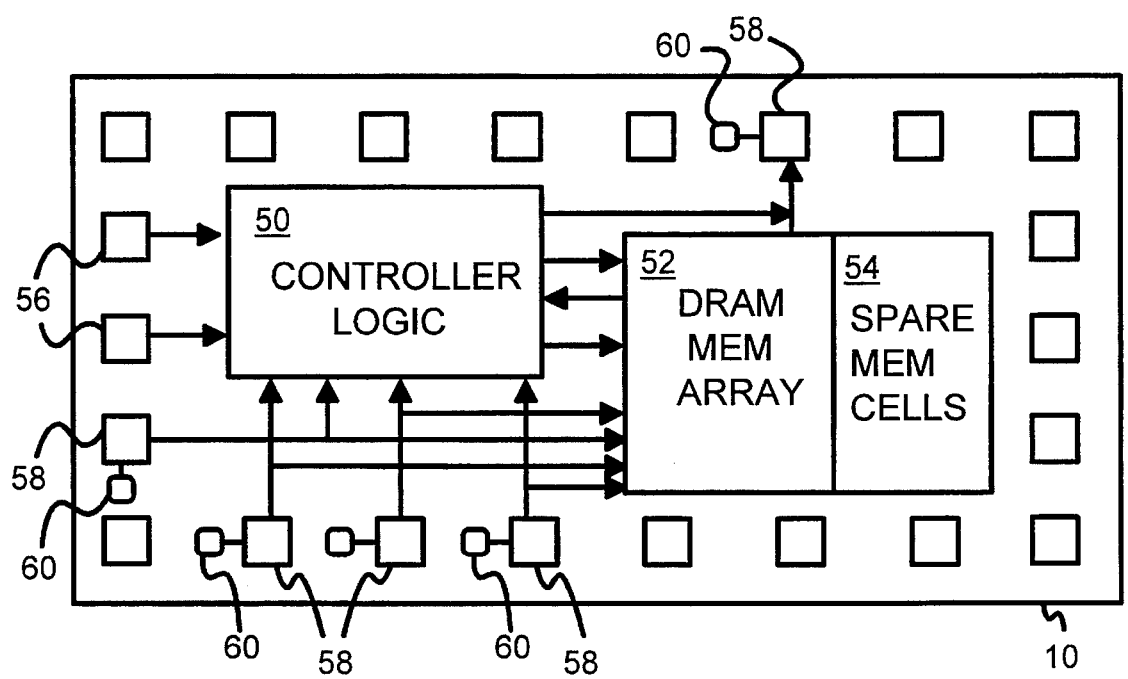
FIG. 9 highlights that auxiliary test pads are needed only for bonding pads which are used to test both the memory and the logic controller portions of the die.

FIG. 9 highlights that auxiliary test pads are needed only for bonding pads which are used to test both the memory and the logic controller portions of the die. Auxiliary test pads 60 are electrically connected to primary bonding pads 58 that connect to both controller logic 50 and to DRAM memory 52. Logic bonding pads 56 which do not directly connect to DRAM memory 52 do not have auxiliary bonding pads. Multiplexers (not shown) are used to selectively connect either controller logic 50 or DRAM memory 52 to the shared bonding pads 58. Spare memory cells 54 are activated by blowing fuse elements during laser repair. Spare memory cells 54 are selected rather than faulty cells in DRAM memory 52.

Auxiliary pad 60 is preferably located adjacent to primary bonding pad 58 and may be electrically connected with a small metal line. Primary bonding pad 58 is 100 μm (microns) in length and width (on a side), or about 4 mils. Auxiliary pad 60 is only 75 μm on a side, a 3 mil pad, since a smaller size may be used when probing but not bonding to a pad. Bonds require a larger pad size to accommodate the solder bump or the bond, but merely touching a probe tip to a pad can be done on a smaller-sized pad. Both pads 58, 60 are made out of soft metal such as pure aluminum or as an alloy with copper, about 1 μm in thickness. Several metal layers may be combined to increase its thickness, or just the top metal layer may be used. The corners of auxiliary pad 60 may be rounded to allow wafer probing equipment to automatically identify auxiliary pads and distinguish them from primary bonding pads.

For the preferred embodiment, a video controller chip is packaged in a 176-pin package. Most of these 176 pins are used for input and output to the video controller, such as for controlling transfer of pixel data from a host bus and converted pixel data to an external display such as a CRT or flat panel. The memory embedded in the video controller chip is a video memory and must be a certain size for comparability with different resolution modes for display. Higher resolutions contain more pixels and thus more video memory is needed. This video memory is on the order of one megabyte in size. Static RAM is not dense enough for integration onto the controller chip, so DRAM is used. In the test mode the embedded DRAM can be externally controlled by the following signals:

| | |
|---|---|
| 8 | Data Input/Output signals |
| 16 | Address Signals |
| 12 | RAS, CAS, and byte enable or select signals |

About 36 signal pins are needed to connect directly to the embedded DRAM. While the package could be increased by 36 pins to about 220 pins, this significantly increases cost. Instead, about 33 of the video controller I/O pins are multiplexed with the DRAM signals as shown for FIGS. 6, 7. The embedded DRAM can be much wider than 8 bits since byte enables or select signals can select one 8-bit byte out of the DRAM's wider data path.

About 19 power, ground, and substrate bias inputs are also needed to test the embedded DRAM. Thus the total number of pins used for memory test is about 55, while over 150 pins are used for logic testing. The logic tester can provide a limited number of 'random' 150-pin test vectors, but not enough to fully test the large embedded memory. The memory tester only has to provide 55-pin test vectors, and since there is a pattern to the test sequence, a test program can generate these test vectors on the fly as the test is in progress.

The logic testing can indirectly test the embedded DRAM by storing and retrieving pixel data from it, but this process is slow since several clock cycles are required to process the pixel data through the video controller. The pixel data manipulations are complex so it is difficult to determine what data is actually being stored in the embedded DRAM. Thus it is much more efficient to test the embedded DRAM in isolation from the controller.

Two different probe cards are used to test the chip. A 176-pin probe card makes contact with all 176 primary bonding pads and is used by the logic tester. A smaller 55-pin probe card makes contact with the auxiliary test pads which connect to the memory. The 55-pin probe card is used by the memory tester.

TESTING METHOD—FIG. 10

Figure 10:
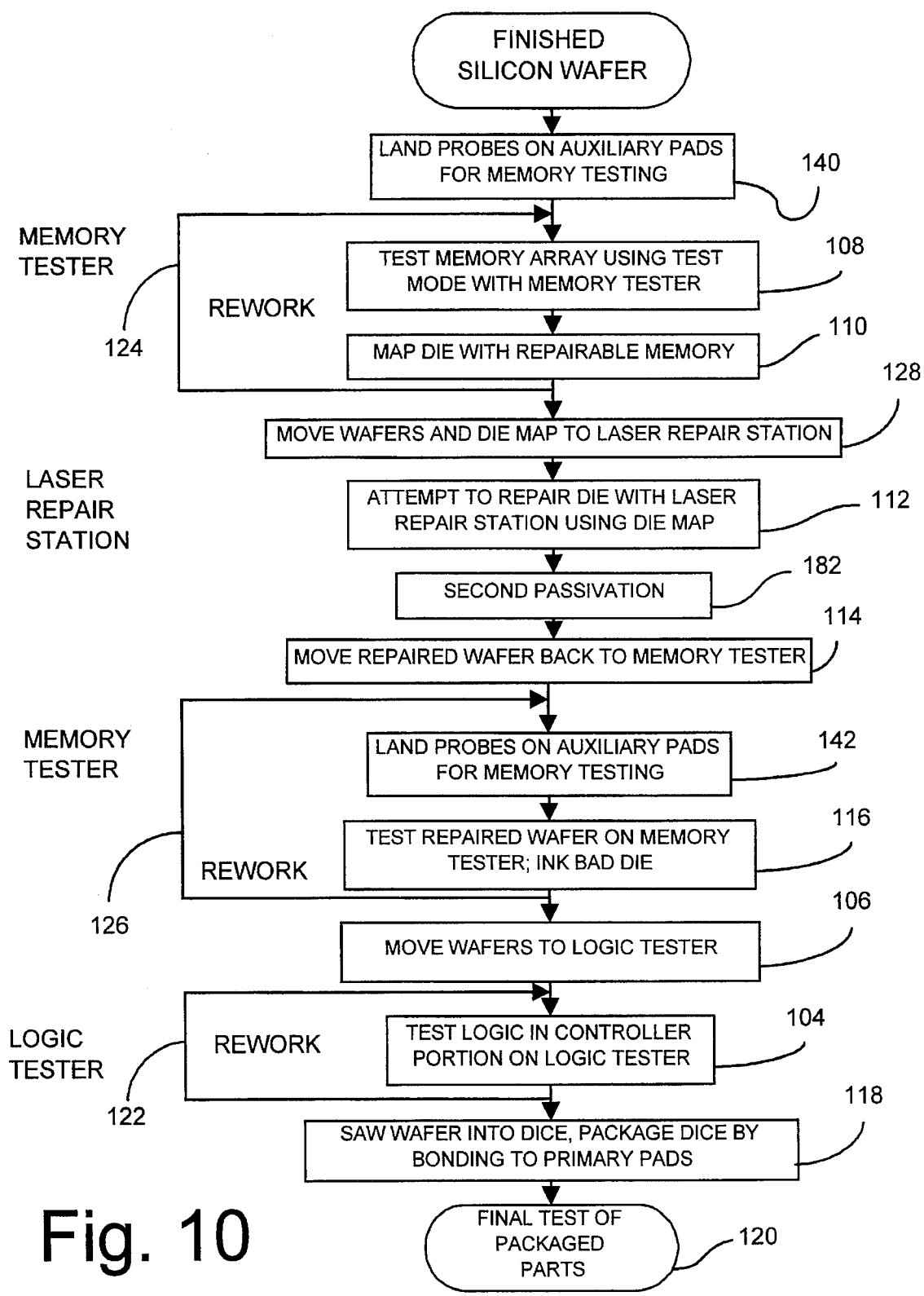
FIG. 10 is a flow of the method used to test the logic controller chip with the large embedded memory.

FIG. 10 is a flow of the method used to test the logic controller chip with the large embedded memory. The finished silicon wafer contains many die separated by scribe lines. Perhaps fifty to several hundred die are patterned onto a wafer. Many of these die are defective.

The wafer is first loaded onto a memory tester and a 55-pin probe card successively probes each die on the wafer. The memory tester uses a probe card that has only 55 probes which contact the auxiliary test pads rather than the primary bonding pads. This probe card is lowered to make contact with the auxiliary test pads, step 140. Each die is first tested for opens and shorts, and for drawing too much power-supply current (Icc). If any of these tests fail, the die is bad and the next die is probed. These continuity tests are typically repeated each time a die is tested on any test machine to protect the expensive test machine from damage. The embedded memory is directly tested by activating the test mode and connecting the 55 bonding pads with the auxiliary test pads directly to the embedded memory rather than to the controller logic (step 108). Die are identified that are faulty, but that are possibly repairable by replacing a faulty memory cell with a spare memory cell. These repairable die typically have only a few bad memory cells rather than hundreds or thousands of bad memory cells. The repairable die and the locations within the embedded memory of the faulty cells are mapped so that they can be later found and repaired, step 110. Unrepairable die are inked, possibly with a different color of ink.

Rework 124 may be necessary due to operator or machine error or a faulty probe card. Thus one or two gouges may be left on each auxiliary test pad, but no marks are left on the primary bonding pads by memory testing.

The wafers and the repair map are then transported to a laser repair station, step 128. The laser repair station has a laser that can precisely be aligned to fuse elements on the die. The repair map is used to move and fire the laser at particular die and particular fuse elements on the die to replace faulty memory cells with spare cells, step 112. More detailed information on typical laser repair is contained in U.S. Pat. No. 5,326,709 to Moon et al., assigned to Samsung Electronics of the Republic of Korea, hereby incorporated by reference. This reference also shows a laser repair map as FIG. 10.

A second passivation layer is added, step 182, to cover over any holes that may have been made by laser heating above the blown fuses. This second passivation may be polyimide or nitride or other well-known passivation materials. Openings are cut in the second passivation over the primary bonding pads and over the auxiliary test pads.

Once laser repair is completed, the embedded memory must again be tested to determine if the repair was successful. The spare cells may themselves be faulty, or the fuse element could have failed to blow. The wafers are transported back to the memory tester, step 114. The 55-pin probe card is again lowered to make contact with the 55 auxiliary test pads, step 142, and each repaired die is tested using the memory tester, step 116. The die on which repair was attempted but which still fail the memory test are inked. Rework 126 may again be needed, which results in an additional set of gouges on the auxiliary test pads.

The wafers are then transported from the memory tester to a logic tester, step 106. The logic tester is a different test machine and may be more expensive as three or four times the number of pins or test channels are needed with the logic tester. A second, larger probe card is used which contacts all 176 of the primary bonding pads on the die. The logic controller portion of the die is tested, step 104, and faulty die may be marked using an ink drop. Test 104 is repeated for each die on the wafer, and then for other wafers in the batch of wafers. Should rework be necessary, such as when the probe card is seriously mis-aligned or fails to make good contact, or if the ink runs out, then step 104 is repeated. Rework 122 leaves at most two marks or gouges on the primary bonding pads, since the 176-pin probe card makes contact with the primary bonding pads.

Finally the wafer is sawed or scribed and divided into individual die, step 118. The die without any ink drops are good or successfully repaired die and are packaged. During packaging, wires are bonded to the primary bonding pads to electrically connect the die with the leads on the package. The final packaged die are tested once more on the logic tester, but no probe card is needed since the die are already packaged. A small percentage of the packaged die fail because of packaging defects.

The final packaged parts have up to four gouges on each auxiliary pad, but only one or two gouges on the primary pads. With no rework at all, only one gouge occurs on the primary bonding pads, while two gouges may appear on the auxiliary pads. Since wires are only bonded to the primary pads, the bonds are reliable as only one or two gouges can occur on any bonding pad. The auxiliary pads are 'sacrificed' for testing and may contain up to four gouges. Since bonding never occurs to these auxiliary pads, the gouges cannot lessen wire-bond reliability.

ADVANTAGES OF THE INVENTION

Since only 55 pins are used by the memory tester, while all 176 pins are used by the logic tester, the memory test machine can be a less expensive machine than the logic tester. This can reduce test cost since a less expensive test machine with fewer test channels is used for some of the required tests.

The controller with the embedded memory may be manufactured by a DRAM manufacturing foundry and first tested with the foundry's DRAM memory tester before and after laser repair. The wafers may then be shipped from the foundry to another facility and tested with a logic tester. Thus the foundry's DRAM testers may be used while a separate logic tester, possibly thousands of miles away, is used.

Each probe touchdown during wafer-sort testing of integrated circuits can leave a gouge in the pad metal. These gouges reduce the reliability of any wire bond to that pad as voids can be left in the bond where the gouges are. The invention provides a second, sacrificial test pad adjacent to the primary bonding pad. The second test pad is electrically connected to the primary bonding pad. This second test pad allows for multiple probing. Multiple probing is needed for memory testing both before and after laser repair. Thus the probes can land on the second test pad multiple times while the wire bond is made to the primary bonding pad.

ALTERNATE EMBODIMENTS

Several other embodiments are contemplated by the inventor. For example a test mode connects some of the logic pins directly to the embedded memory while disconnecting the normal pin function. Multiplexers have been described for the preferred embodiment to implement this memory test mode. These multiplexers are placed on the shared pins, which are some of the input and output pins normally used by the logic controller portion of the chip. An extra pin or an unused or invalid combination of inputs was described as initiating the test mode and mux the embedded memory's I/O to the shared pins. However, those of skill in the art will recognize many equivalents to the multiplexer function and for activating the test mode. The test mode input may be activated by a low voltage rather than a high voltage.

The probe card for the logic test, which makes contacts to all 176 pins, may make contact to the primary bonding pads for all pins, or it may make contact to the primary bonding pads for the logic pads, but make contact to the auxiliary bonding pads for those pins which have the auxiliary bonding pads.

A one-megabyte video memory has been described as requiring four million test vectors to fully test the memory. A 512K-byte video memory requires about two million test vectors for complete coverage, while a 256K-byte video memory requires one million test vectors. Other memory sizes require a proportionate number of test vectors, and the exact number of test vectors is an estimate and will vary.

While the wafer-sort probe card has been described as being lowered to make contact with the die on the wafer, the wafer itself may be raised while the probe card remains stationary. Embedded dynamic RAM using capacitors for storage are preferred, although embedded erasable-programmable read-only memories (EPROM) or Flash memories (EEPROM) may also benefit from the invention. While silicon wafers are currently preferred, in the future other manufacturing methods or substances such as GaAs may be employed to make the die. A 176-pin logic device has been described with about 55 of its pins being multiplexed for memory test mode. However, other device sizes and pin counts are possible and would still benefit from the invention. Many types of packages may be used; some less expensive packages combine the bonding wire with the lead as one discrete lead-wire, yet its function with respect to the invention is equivalent.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A large-scale integrated circuit comprising:
    a plurality of bonding pads;
    a logic controller connecting to each of the plurality of bonding pads;
    a memory embedded in the large-scale integrated circuit, the memory being accessed by the logic controller but not directly accessible by the plurality of bonding pads in a normal mode of operation;
    a subset of shared pads in the plurality of bonding pads;
    auxiliary test pads having a length and width sufficiently large for probing by a wafer sort tester but insufficiently large for forming a wire bond to the auxiliary test pad;
    wherein each shared pad in the subset of shared pads is electrically connected to a different auxiliary test pad; and
    multiplexer means, connected to the shared pads, for connecting the shared pads to the logic controller during the normal mode of operation but connecting the shared pads directly to the memory during a memory test mode;
    whereby the auxiliary test pads have a size sufficient for wafer-sort probing, but the bonding pads electrically connected to the auxiliary pads must be used for wire bonding.

2. The large-scale integrated circuit of claim 1 further comprising:
    a package surrounding the integrated circuit, the package having external leads for electrical connection to a system, the package having wires bonded to the external leads and bonded to the plurality of bonding pads but not bonded to the auxiliary test pads.

3. The large-scale integrated circuit of claim 2 further comprising:
    spare memory cells, coupled to the memory;
    fuse elements for replacing a connection to a faulty memory cell in the memory with a spare memory cell.

4. The large-scale integrated circuit of claim 3 wherein the fuse elements are normally closed but are blown open by a laser pulse.

5. The large-scale integrated circuit of claim 4 wherein the memory is a dynamic random-access memory having at least one million bits of storage.

6. The large-scale integrated circuit of claim 5 wherein the logic controller is a video controller for manipulating pixel data for display on a screen, and wherein the memory is a video memory containing pixel data for display on the screen.

7. The large-scale integrated circuit of claim 3 wherein the auxiliary test pads contain multiple gouges from probing before and after the fuse elements are blown, but the bonding pads have no more than two gouges per pad from probing,
    whereby reliability of the wires bonded to the bonding pads is increased by probing and gouging the auxiliary test pads rather than the bonding pads.

8. The large-scale integrated circuit of claim 3 wherein each auxilary test pad is located adjacent to the primary bonding pad which it is electrically connected to.

9. A method for testing a complex integrated circuit having a logic portion and an embedded memory, the method comprising:

applying sufficient force to a first probe card to make electrical contact with auxiliary test pads on a die on a wafer, the die containing the complex integrated circuit;

testing the embedded memory on the die on the wafer using the first probe card to connect the die to a memory test machine, the memory test machine applying voltages representing test inputs to the die and comparing expected outputs to voltages output from the die;

transporting the wafer from the memory test machine to a logic test machine;

applying sufficient force to a second probe card to make electrical contact with primary bonding pads on the die on the wafer, each auxiliary test pad being electrically connected on the die to one of the primary bonding pads;

testing the logic portion of the die on the wafer using the second probe card to connect the die to the logic test machine, the logic test machine applying voltages representing test inputs to the die and comparing expected outputs to the voltages output from the die;

sawing the wafer into individual die and separating out good die that did not fail when tested on the logic test machine and did not fail when tested on the memory test machine; and bonding wires to the primary bonding pads of the good die but not bonding to the auxiliary test pads, whereby the auxiliary test pads are used for testing the embedded memory.

10. The method of claim 9 further comprising the steps of:

transporting the wafer from the memory test machine to a laser repair station;

attempting to repair a faulty embedded memory by firing a laser at a fuse element in the embedded memory, the fuse element selecting a spare memory cell on the die to replace a faulty memory cell detected by the memory test machine;

transporting the wafer from the laser repair station back to the memory test machine;

applying sufficient force to the first probe card to make electrical contact with the auxiliary test pads on the die; and testing the embedded memory on the die after repair by the laser repair station, using the first probe card to connect the die to a memory test machine, the memory test machine applying voltages representing test inputs to the die and comparing expected outputs to the voltages output from the die.

11. The method of claim 10 further comprising the step of:

enabling a test mode on the die during testing of the embedded memory, the test mode directly connecting the embedded memory to the auxiliary test pads and by passing the logic portion of the die.

12. The method of claim 11 wherein the first probe card makes contact to fewer pads than the second probe card, the first probe card having fewer probes than the second probe card.

13. The method of claim 12 wherein the memory test machine applies voltages representing test inputs to fewer inputs on the die and compares expected outputs to the voltages output from the die for fewer outputs than does the logic test machine, whereby the logic test machine tests more signals from the die than does the memory test machine.

14. The method of claim 13 wherein the embedded memory requires about one million vectors to fully test each memory cell for storage and leakage to neighboring memory cells.

15. The method of claim 14 wherein the step of testing the embedded memory comprises one million test cycles, with a different test vector being applied to the test inputs for each test cycle, and wherein the memory test machine executes a high-level test program which generates each test vector before being applied to the test inputs and discards the test vector after it is applied, whereby the memory test machine does not store a million test vectors.

16. The method of claim 15 wherein the logic test machine retrieves test vectors from a storage, the storage having a capacity of less than the one million test vectors for testing the embedded memory.

17. The method of claim 10 further comprising the steps of:

burning a hole in a passivation layer above the fuse element on the die when firing the laser at the fuse element in the embedded memory;

covering the hole in the passivation layer with a second passivation layer;

forming openings in the second passivation layer over the primary bonding pads and over the auxiliary bonding pads.

18. The method of claim 10 further comprising the steps of:

generating a repair map when testing the die on the memory test machine;

transporting the repair map to the laser repair station; and using the repair map to locate die with repairable memories, the laser being fired at the fuse element in the embedded memory for die indicated as being repairable by the repair map.

19. The method of claim 10 further comprising the steps of:

marking die with faulty logic portions;

marking die with unrepairable faulty embedded memories; and marking die with unsuccessfully repaired embedded memories.

* * * * *